United States Patent
Buchanan

(10) Patent No.: US 10,169,297 B2
(45) Date of Patent: Jan. 1, 2019

(54) RESISTIVE MEMORY ARRAYS FOR PERFORMING MULTIPLY-ACCUMULATE OPERATIONS

(71) Applicant: Hewlett Packard Enterprise Development LP, Houston, TX (US)

(72) Inventor: Brent Buchanan, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 97 days.

(21) Appl. No.: 15/500,486

(22) PCT Filed: Apr. 16, 2015

(86) PCT No.: PCT/US2015/026215
§ 371 (c)(1),
(2) Date: Jan. 30, 2017

(87) PCT Pub. No.: WO2016/167778
PCT Pub. Date: Oct. 20, 2016

(65) Prior Publication Data
US 2017/0220526 A1     Aug. 3, 2017

(51) Int. Cl.
*G06F 17/16* (2006.01)
*G11C 7/10* (2006.01)
(Continued)

(52) U.S. Cl.
CPC .............. *G06F 17/16* (2013.01); *G06F 7/50* (2013.01); *G06F 7/523* (2013.01); *G06F 7/5443* (2013.01);
(Continued)

(58) Field of Classification Search
CPC . G06F 17/16; G06F 7/50; G06F 7/523; G11C 13/004
(Continued)

(56) References Cited

U.S. PATENT DOCUMENTS 5,522,085 A * 5/1996 Harrison ................. G06F 17/10
708/523
5,596,518 A   1/1997 Toyokura et al.
(Continued)

OTHER PUBLICATIONS

Truong, S. N., et al.; "New Memristor-Based Crossbar Array Architecture with 50-% Are Reduction and 48-% Power Saving for Matrix-Vector Multiplication of Analog Neuromorphic Computing"; Jun. 30, 2014, pp. 356-363.
(Continued)

*Primary Examiner* — Tan V Mai
(74) *Attorney, Agent, or Firm* — Hewlett Packard Enterprise Patent Department

(57) ABSTRACT

In one example in accordance with the present disclosure a resistive memory array is described. The array includes a number of resistive memory elements to receive a common-valued read signal. The array also includes a number of multiplication engines to perform a multiply operation by receiving a memory element output from a corresponding resistive memory element, receiving an input signal, and generating a multiplication output based on a received memory element output and a received input signal. The array also includes an accumulation engine to sum multiplication outputs from the number of multiplication engines.

14 Claims, 7 Drawing Sheets

(51) Int. Cl.
*G11C 13/00* (2006.01)
*G06F 7/544* (2006.01)
*G06F 7/50* (2006.01)
*G06F 7/523* (2006.01)

(52) U.S. Cl.
CPC .......... *G11C 7/1006* (2013.01); *G11C 13/004* (2013.01); *G06F 2207/4802* (2013.01); *G11C 2213/77* (2013.01)

(58) Field of Classification Search
USPC .................................................. 708/523, 524
See application file for complete search history.

(56) References Cited

U.S. PATENT DOCUMENTS

| | | | | |
|---|---|---|---|---|
| 5,859,789 A | * | 1/1999 | Sidwell | G06F 7/5443 |
| | | | | 708/523 |
| 5,983,256 A | * | 11/1999 | Peleg | G06F 7/4812 |
| | | | | 708/523 |
| 6,557,022 B1 | | 4/2003 | Sih et al. | |
| 8,909,580 B2 | | 12/2014 | Nugent et al. | |
| 9,785,615 B1 | * | 10/2017 | Merced Grafals | G06F 17/16 |
| 2011/0024716 A1 | | 2/2011 | Bratkovski | |
| 2011/0169136 A1 | | 7/2011 | Pickett et al. | |
| 2013/0028004 A1 | | 1/2013 | Snider | |
| 2013/0223132 A1 | | 8/2013 | Perner | |
| 2014/0016396 A1 | | 1/2014 | Mazumder et al. | |
| 2014/0172937 A1 | | 6/2014 | Linderman et al. | |

OTHER PUBLICATIONS

Fan, D., et al., Hierarchical Temporal Memory Based on Spin-neurons and Resistive Memory for Energy-efficient Brain-inspired Computing [online], Jan. 14, 2014, Retrieved Mar. 13, 2015, 12 Pgs.

Gao, L., et al., Analog-Input Analog-weight Dot-product Operation with Ag/a-Si/Pt Memristive Devices [online], University of California, Retrieved Mar. 13, 2015, 6 Pgs.

International Searching Authority, The International Search Report and the Written Opinion, PCT/US2015/026215, dated Jan. 27, 2016, 11 Pages.

* cited by examiner

RESISTIVE MEMORY ARRAYS FOR PERFORMING MULTIPLY-ACCUMULATE OPERATIONS

STATEMENT OF GOVERNMENT RIGHTS

This invention was made with Government support. The Government has certain rights in the invention.

BACKGROUND

Resistive memory elements, such as memristors are devices that may be programmed to different resistive states by applying electrical voltage or currents to the memristors. After programming, the state of the memristors may be read. The state of the memristors remains stable long enough to regard the device as non-volatile. A number of memristors may be included within a crossbar array in which a number of column lines intersect with a number of row lines, the memristors being located at the intersection of a column line and a row line.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
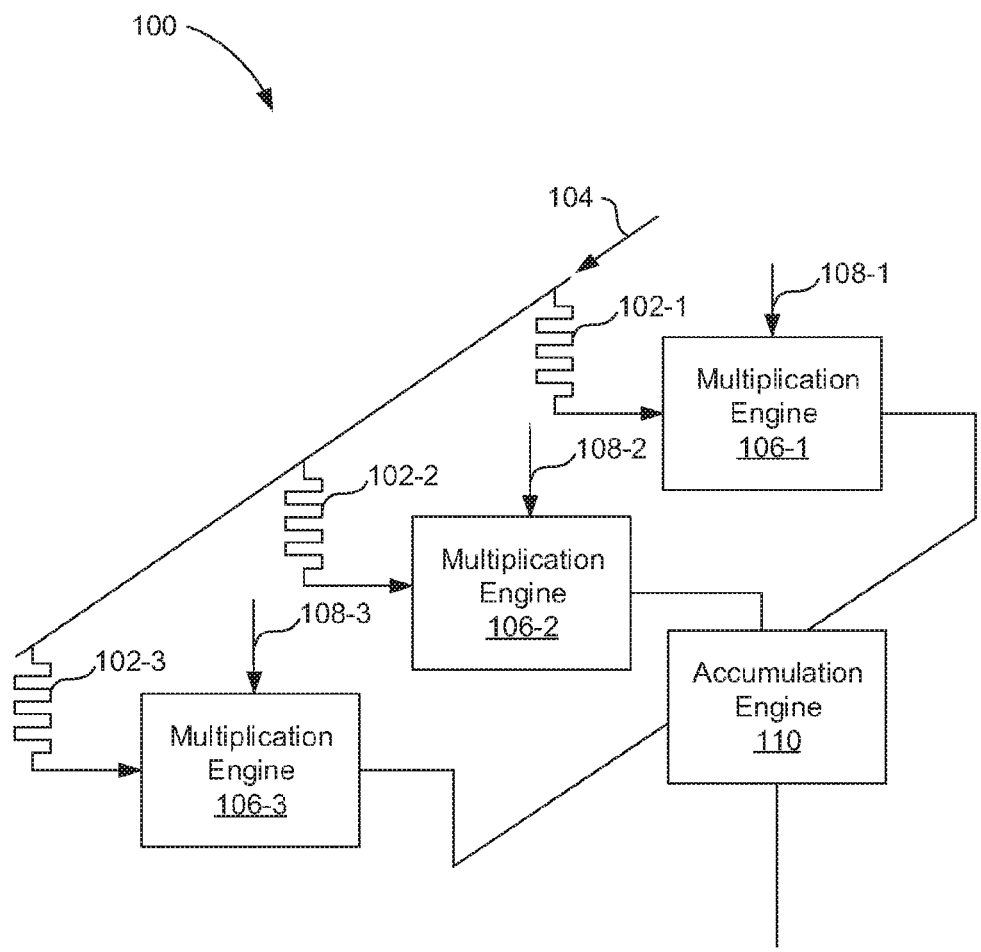
FIG. 1 is a diagram of a resistive memory array for performing a multiply-accumulate (MAC) operation, according to one example of the principles described herein.

Arrays of resistive memory elements such as memristors may be used in a variety of applications, including non-volatile solid state memory, programmable logic, signal processing, control systems, pattern recognition, and other applications. The present application is directed to a resistive memory array used to perform a multiply-accumulate (MAC) operation of, for example, a number of matrix values and a number of input vector values. In other words, a resistive memory array can be used to perform vector-matrix or multiply-accumulate computations. For example, an input voltage signal along each row of an array is weighted by the resistance of the resistive memory elements, in columns and accumulated as the current output from each column.

Multiply-accumulate operations or dot product operations may be used in a number of applications. For example, given a received audio signal or a received video signal, a user may desire to filter, perform a Fast Fourier Transformation of the signal, or otherwise process an analog or digital signal. In these examples, a multiply-accumulate operation or dot product operation is used for performing such processing. Given the wide use of MAC operations in discrete-time or discrete-space signal processing, the optimization of such a process is desirable to increase the efficiency of digital signal processing. In some examples, resistances of resistive memory elements in an array may be used as the matrix values that an input signal is to be multiplied by in a MAC operation.

Accordingly, the present specification describes a resistive memory array for performing a MAC operation. The array includes a number of resistive memory elements to receive a common-valued read signal. A resistance of a resistive memory element defines a value within a matrix. The array also includes a number of multiplication engines to perform a multiply operation by 1) receiving a memory element output from a corresponding resistive memory element, 2) receiving an input signal, and 3) generating a multiplication output based on a received memory element output and a received input signal. The array also includes an accumulation engine to sum multiplication outputs from the number of multiplication engines. Summed multiplication outputs represent a multiplication of the matrix and a number of input signals.

The present specification also describes a method for performing a multiply-accumulate operation. According to the method, a common-valued read signal is applied to inputs of a number of resistive memory elements. A number of input signals are also applied to a number of multiplication engines. A multiplication engine is coupled to a resistive memory element. A number of multiplication outputs from the number of multiplication engines are summed. A multiplication output represents a multiplication of a resistive memory element output and an input signal. An array output is determined based on a summed number of multiplication outputs.

The present specification also describes a computing device. The device includes a processor and a resistive memory array coupled to the processor. The resistive memory array includes a number of resistive memory elements to receive a common-valued read voltage. A resistance of a resistive memory element defines a value within a matrix. The resistive memory array also includes a number of multiplication engines to perform a multiplication operation. A multiplication engine is respectively coupled to a resistive memory element, is to receive a resistive memory element output current, and is to output a multiplication current. A multiplication engine includes an operational amplifier to amplify the resistive memory element output current and an input converter to convert a received input voltage into a resistance, in which the received input voltage represents an input signal to be multiplied by the matrix. The resistive memory array also includes an accumulation engine to sum a number of multiplication currents to generate an array output voltage.

Using the single read signal value to perform a MAC operation may allow for flexibility in selecting a read signal to 1) increase the signal-to-noise ratio to result in a more deterministic MAC result and 2) maintain the state, i.e., not change the state, of the resistive memory elements, which change in state may invalidate any obtained MAC result. For example, resistive memory elements such as memristors may change state as a received voltage is greater than a switching voltage of the memristor. In other words, if a received voltage is greater than the switching voltage of the memristor, the memristor may change state, thus changing the coefficients of the matrix and invalidating the matrix used in the dot product. Accordingly, if an input vector is passed directly to a memristor array, the input vector's largest entry cannot exceed the memristor switching voltage, and input vector entries may be scaled down accordingly. In other words, all but the largest of the input voltages are scaled, and are therefore smaller than the maximum possible voltage. In some instances the scaling results in input voltages that are much smaller than they could be. As such, some memristors in a MAC unit may receive less than the largest possible input signal, which may increase a noise-to-signal ratio and otherwise complicate output detection.

Accordingly, by using a common-valued read signal that is less than the switching voltage of the memristor, and inputting an input signal into a multiplication engine and not the memristor, a memristor state is preserved and an accurate and reliable MAC is ascertained.

As used in the present specification and in the appended claims, the term "memristor" may refer to a passive two-terminal circuit element that maintains a functional relationship between the time integral of current, and/or the time integral of voltage.

Further, as used in the present specification and in the appended claims, the term "common-valued" may refer to signals that are the same value. For example, a common-valued read signal may be a shared read signal or may be different instances of read signals that share a value.

Further, as used in the present specification and in the appended claims, the term "instance" as in "different instance" or "distinct instance" may refer to a read signal that is the same value. For example, each resistive memory element may receive a "different instance" of a read signal meaning that each resistive memory elements receives a distinct signal but that shares a signal value with signals received by other resistive memory elements.

Still further, as used in the present specification and in the appended claims, the term "multiply-accumulate operation" is meant to be understood broadly as the product of two vectors to form a scalar, whose value is the product of the magnitudes of the vectors and the cosine of the angle between them and the summation of those products. In one example, the vectors may be represented as matrices that may be multiplied. Other names for a multiply-accumulate operation include dot product, scalar product, and inner product. A MAC calculation is a computationally expensive task for a digital computer. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense.

Still further, as used in the present specification and in the appended claims, the term "weight" may refer to the matrix of coefficients used in performing a dot product. Each coefficient of the weight may be indicated by a particular resistive memory element in an array.

Still further, as used in the present specification and in the appended claims, the term "stable MAC engine" is meant to be understood broadly as a MAC engine that includes resistive memory elements that do not exhibit a state change resultant from an input signal and whose weight is read by applying a read voltage, independent of the input voltage, to a resistive memory element.

Still further, as used in the present specification and in the appended claims, the term "switching voltage" may refer to a voltage potential across a resistive memory element which effectuates a change in the resistance state of the resistive memory element. For example, a switching voltage of a memristor may be between 1-2 volts (V). In this example, a voltage potential across the memristor that is greater than the switching voltage (i.e., the 1-2 V) causes the memristor to change between resistance states. While specific reference is made to a voltage pulse, the activation energy to change the state of the memristor may also be provided by a current source.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a resistive memory array (100) for performing a MAC operation, according to one example of the principles described herein. In general, multiplication engines (106) of the resistive memory array (100) may receive an input signal (108) that is representative of a signal to be multiplied as part of a MAC operation. The multiplication engines (106) may also receive a memory element output that is indicative of a resistance level of the corresponding resistive element (102); which resistance level indicates a coefficient of a MAC matrix. Outputs for a number of multiplication engines (106) are summed to generate an output array that represents a multiplication of a matrix and a number of input signals (108) and a summation of the multiplication.

More specifically, the resistive memory array (100) may include a number of resistive memory elements (102). Resistive memory elements (102) may refer broadly to memory elements that rely on changes in resistive state to store information. For example, the resistive memory elements (102) may be memristors. Other examples of resistive memory elements include resistive random-access memory (RRAM) elements, phase-change random-access memory (PCRAM), and magnetoresistive random-access memory (MRAM).

Resistive memory elements (102) such as memristors may use resistance levels to indicate a particular logic value such as a 1 or a 0. In using a memristor as a resistive memory element (102) in a memory array (100), a digital operation is emulated by applying an activation energy, such as voltage pulses of different values or polarities, to place the memristor in a "low resistance state" which resistance state is associated with a logical value, such as "1." Similarly, a voltage pulse of a different polarity, or different value, may place the memristor in a "high resistance state," which resistance state is associated with another logical value, such as "0."

Memristance is a property of the electronic component referred to as a memristor. Each memristor may have a switching voltage; current running across the memristor that produces a voltage less than the switching voltage does not cause a change in state of the memristor. If the flow of charge is stopped by turning off the applied voltage, the component will "remember" the last resistance that it had, and when the flow of charge starts again the resistance of the circuit will be what it was when it was last active. A memristor is a resistor device whose resistance can be changed.

The conductance channels in the memristors may be formed in each of the memristors and the memristors may be individually addressed as bits. The resistive memory elements (102) may be built at the micro- or nano-scale and used as a component in a wide variety of electronic circuits, such as, bases for memories and logic circuits. When used as a basis for memories, the resistive memory elements (102) may be used to store a bit of information, 1 or 0. When used as a logic circuit, as described herein, the resistive memory elements (102) may be employed to represent bits in a field programmable gate array, as the basis for a wired-logic programmable logic array, or, as described herein, as a dot product engine. The resistive memory elements (102) disclosed herein may also find use in a wide variety of other applications. The resistive memory elements (102) may be fabricated through any reasonably suitable fabrication process, such as, for example, chemical vapor deposition, sputtering, etching, lithography, or other methods of forming memristors. While FIG. 1 depicts three resistive memory elements (102-1, 102-2, 102-3) any number of resistive memory elements (102) may be implemented according to the principles described herein.

The resistive memory elements (102) may be used in matrix multiplication. For example, a resistance of a resistive memory element (102), or a value indicative of the resistance of a resistive memory element (102), may represent a coefficient within a matrix that is to be multiplied by an input signal (108). An initial programming signal may be used to change the resistance values at each individual resistive memory element (102) in order to set the resistivity of the memory elements (102) to a predetermined value to create a representation (e.g., a mapping) of a mathematic matrix in which each resistance value at each resistive memory element (102) represents a value within the matrix. This change in resistance among the individual resistive memory elements (102) is an analog change from a low-to-high value or a high-to-low value. In this manner, the resistive memory elements (102) are "memory resistors" in that they "remember" the last resistance that they had.

The resistive memory elements (102) within the resistive memory array (100) may be set to any number of resistance levels. For example, some resistive memory elements (102) may be set to a resistance level of approximately 1,000 ohms ($\Omega$) while other resistive memory elements (102) may be set to a resistance level of approximately 1,000,000$\Omega$. Using an initial programming vector signal to set the resistive memory elements (102) to different resistance levels creates a mapping between a matrix of values and the resistance level. For example distinct resistance levels may represent distinct coefficients in a matrix.

To determine a resistance of the resistive memory elements (102), a read signal (104) is passed through the number of resistive memory elements (102). As the read signal (104) is passed to the number of resistive memory elements (102), each resistive memory element (102) may generate a memory element output that is received by a multiplication engine (106). The memory element output may be a signal that indicates a resistance level, and a corresponding matrix coefficient, of a corresponding resistive memory element (102).

In some examples, the number of resistive memory elements (102) may receive a common-valued read signal (104). The common-valued read signal may be a shared read signal or different instances of a same-valued a read signal. In other words, each resistive memory element (102) may receive a read signal that has the same value as read signals received by other resistive memory elements. The common-valued read signal (104) may be a signal that maintains the resistance state, represented by the number of resistive memory elements (102). Not maintaining the resistance state may result in faulty MAC operation. For example, if a read signal is larger than the switching voltages of the resistive memory elements (102), at least a portion of the resistive memory elements (102) may change state, and also change a corresponding matrix coefficient. Such a change to the matrix coefficient of a matrix alters the digital signal processing and may lead to incorrect signal processing. Accordingly, the common-valued read signal (104) may be selected to be a largest signal that is less than a switching value for the number of resistive memory elements (102) to ensure that the resistive memory element state is preserved, and not changed, thereby ensuring the validity of a MAC result.

Passing a common-valued read signal (104) that is a largest value that does not switch the state of the resistive memory elements (102) may also allow for a more efficient signal-to-noise ratio. For example, when an input signal is passed directly to a resistive memory element (102) to determine the matrix value indicated by the resistive memory element (102), the input signal may be small enough that the resulting output of the resistive memory element (102) is likewise small. Such small outputs are more prone to become lost in noise. Accordingly, by passing a common-valued read signal (104) to the resistive memory elements (102) instead of an input signal (108), the size of the common-valued read signal (104) may be selected such that it produces a larger memory element output while maintaining the state of the resistive memory element (102).

The resistive memory array (100) may also include a number of multiplication engines (106) that receive an input signal (108). The multiplication engines (106) may include a combination of hardware and program instructions to perform a designated function. The multiplication engines (106) may be just hardware. For example, the multiplication engines (106) may be implemented in the form of electronic circuitry (e.g., hardware).

The input signal (108) may be in one form (i.e., a voltage or a current) that is representative of a signal, such as an audio signal, a video signal, or other analog or digital signal, that is to be filtered, transformed, convoluted, or otherwise processed by a matrix of values, which matrix of values are represented by the resistances of the number of resistive memory elements (102). The number of multiplication engines (106) may also receive a memory element output from a corresponding resistive memory element (102). For example, each of the multiplication engines (106-1, 106-2, 106-3) may be respectively coupled to a corresponding one of the number of resistive memory elements (102-1, 102-2, 102-3). The output of the resistive memory elements (102) may be a function of the resistance of the resistive memory element (102) and the common-valued read signal (104) passed to the number of resistive memory elements (102). Specifically, the output of the resistive memory element (102) may be a current proportional to the resistance, and stored value, of the resistive memory element (102). Each multiplication engine (106) may generate a multiplication output based on a received memory element output and a received input signal (108).

A specific example of generating a multiplication output is given as follows. In this example, an input signal (108-1) to a first multiplication engine (106-1) may be a voltage that is converted to a resistance, $R_{input\_1}$, and the memory element output may be a current, $I_1$, that is a function of the common-valued read voltage, $V_{read}$, and a conductance, $G_1$, of a first resistive memory element (102-1), in which $G_1$ is the conductance, or the reciprocal of the resistance, $R_1$, of the first memory element (102-1). Accordingly, an output of the first multiplication engine (106-1), $V_{out\_1}$, may be represented by Equation 1 presented below.

$$V_{out\_1} = -G_1 \times R_{input\_1} \times V_{read} \quad \text{Equation 1.}$$

The resistive memory array (100) may also include an accumulation engine (110) to sum multiplication outputs from the number of multiplication engines (106) to generate an array output. The accumulation engine (110) may include a combination of hardware and program instructions to perform a designated function. The accumulation engine (110) may be just hardware. For example, the accumulation engine (110) may be implemented in the form of electronic circuitry (e.g., hardware). The accumulation engine (110) may sum the outputs to generate an array output. For example, if the multiplication output is a voltage, the accumulation engine (110) may include a number of resistors, each resistor respectively coupled to a multiplication engine (106) to convert the output voltages into a current. The accumulation engine (110) may also include circuitry to sum the different multiplication outputs. The collected multiplication outputs, or the array output, may represent a dot product of the matrix and a number of input signals (108). In other words, using Equation 1 above for each of the multiplication engines (106), an array output, $V_{array\_out}$ may be represented by Equation 2 as presented below.

$$V_{array\_out} = \Sigma_i V_{out\_i} \quad \text{Equation 2.}$$

In equation 2, "i" represents the i-th multiplication outputs. As described above, using a common-valued read signals (104) passed to the number of resistive memory elements (102) may allow for use of resistive memory elements (102) without risk of inadvertent changing of state of the resistive memory elements (102), which risk may compromise the validity of the results of the MAC. The common-valued read signal (104) may also allow for use of a tailored common-valued read signal (104) which prevents inadvertent change to the resistive memory elements (102) and also allows for an improved signal-to-noise ratio for the currents from the resistive memory elements (102).

Figure 2:
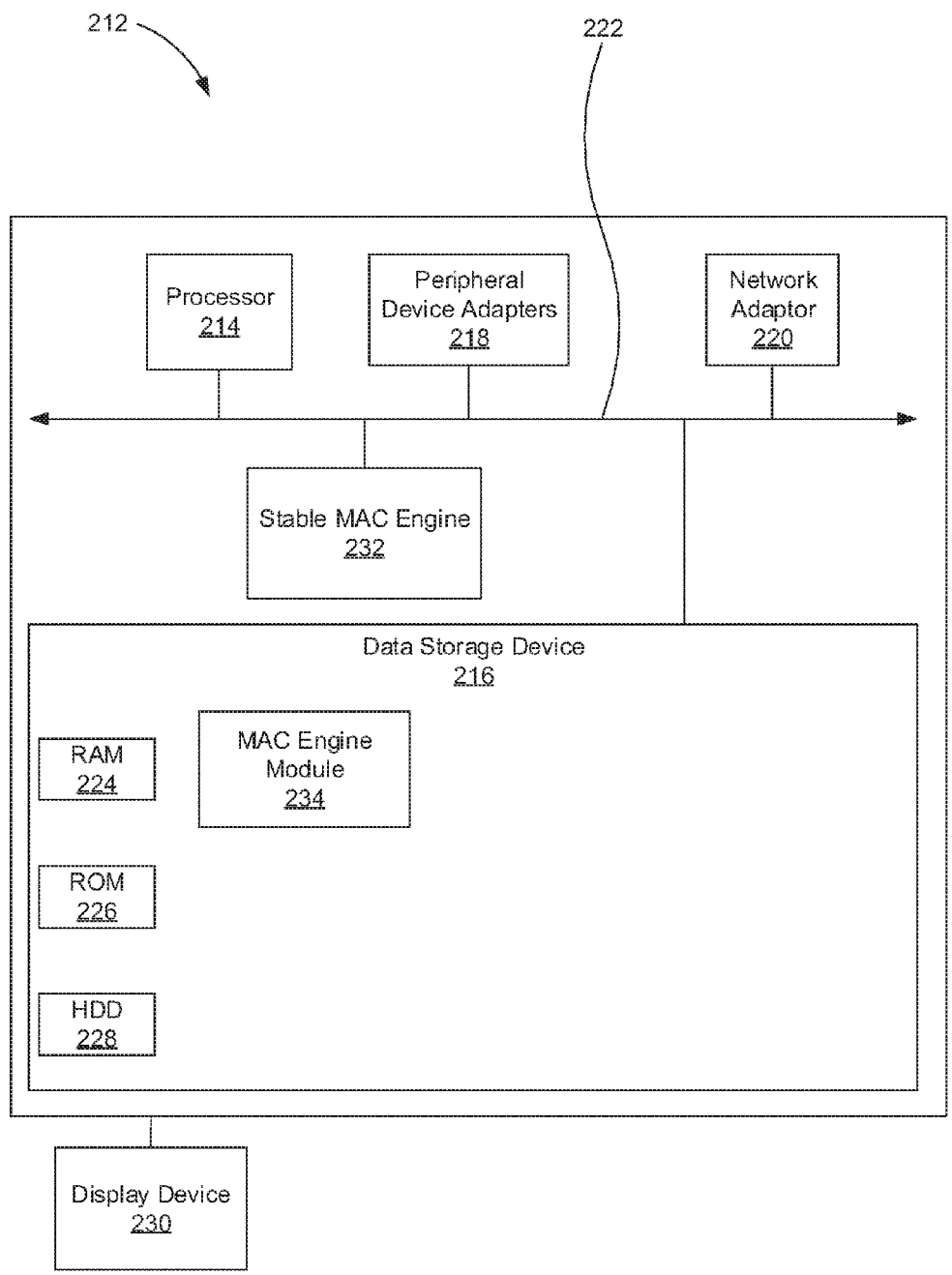
FIG. 2 is a diagram of a computing system for performing a MAC operation, according to one example of the principles described herein.

FIG. 2 is a diagram of a computing system (212) for performing MAC operation, according to one example of the principles described herein. The computing system (212) may be implemented in an electronic device. Examples of electronic devices include servers, desktop computers, laptop computers, personal digital assistants (PDAs), mobile devices, smartphones, gaming systems, and tablets, among other electronic devices.

The computing system (212) may be utilized in any data processing scenario including, stand-alone hardware, mobile applications, through a computing network, or combinations thereof. Further, the computing system (212) may be used in a computing network, a public cloud network, a private cloud network, a hybrid cloud network, other forms of networks, or combinations thereof. In one example, the methods provided by the computing system (212) are provided as a service over a network by, for example, a third party.

To achieve its desired functionality, the computing system (212) includes various hardware components. Among these hardware components may be a number of processors (214), a number of data storage devices (216), a number of peripheral device adapters (218), and a number of network adapters (220). These hardware components may be interconnected through the use of a number of busses and/or network connections. In one example, the processor (214), data storage device (216), peripheral device adapters (218), and a network adapter (220) may be communicatively coupled via a bus (222).

The processor (214) may include the hardware architecture to retrieve executable code from the data storage device (216) and execute the executable code. The executable code may, when executed by the processor (214), cause the processor (214) to implement at least the functionality of performing a MAC operation without disturbing the resistance state of the resistive memory elements (FIG. 1, 102) in a resistive memory array (FIG. 1, 100). The functionality of the computing system (212) is in accordance to the methods of the present specification described herein. In the course of executing code, the processor (214) may receive input from and provide output to a number of the remaining hardware units.

The data storage device (216) may store data such as executable program code that is executed by the processor (214) or other processing device. As will be discussed, the data storage device (216) may specifically store computer code representing a number of applications that the processor (214) executes to implement at least the functionality described herein.

The data storage device (216) may include various types of memory modules, including volatile and nonvolatile memory. For example, the data storage device (216) of the present example includes Random Access Memory (RAM) (224), Read Only Memory (ROM) (226), and Hard Disk Drive (HDD) memory (228). Many other types of memory may also be utilized, and the present specification contemplates the use of many varying type(s) of memory in the data storage device (216) as may suit a particular application of the principles described herein. In certain examples, different types of memory in the data storage device (216) may be used for different data storage needs. For example, in certain examples the processor (214) may boot from Read Only Memory (ROM) (226), maintain nonvolatile storage in the Hard Disk Drive (HDD) memory (228), and execute program code stored in Random Access Memory (RAM) (224).

The data storage device (216) may include a computer readable medium, a computer readable storage medium, or a non-transitory computer readable medium, among others. For example, the data storage device (216) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (218, 220) in the computing system (212) enable the processor (214) to interface with various other hardware elements, external and internal to the computing system (212). For example, the peripheral device adapters (218) may provide an interface to input/output devices, such as, for example, display device (230), a mouse, or a keyboard. The peripheral device adapters (218) may also provide access to other external devices such as an external storage device, a number of network devices such as, for example, servers, switches, and routers, client devices, other types of computing devices, and combinations thereof.

The display device (230) may be provided to allow a user of the computing system (212) to interact with and implement the functionality of the computing system (212). The peripheral device adapters (218) may also create an interface between the processor (214) and the display device (230), a printer, or other media output devices. The network adapter (220) may provide an interface to other computing devices within, for example, a network, thereby enabling the transmission of data between the computing system (212) and other devices located within the network.

The computing system (212) may, when executed by the processor (214), display the number of graphical user interfaces (GUIs) on the display device (230) associated with the executable program code representing the number of applications stored on the data storage device (216). The GUIs may display, for example, interactive screenshots that allow a user to interact with the computing system (212) to input matrix and vector values in association with a stable MAC engine (232) as will be described in more detail below. Additionally, via making a number of interactive gestures on the GUIs of the display device (230), a user may obtain a dot product value based on the input data. Examples of display devices (230) include a computer screen, a laptop screen, a mobile device screen, a personal digital assistant (PDA) screen, and a tablet screen, among other display devices (230).

The computing system (212) may further include a stable MAC engine (232). As will be described in more detail below, the stable MAC engine (232) includes a number of elements including a resistive memory array (FIG. 1, 100) to perform a MAC operation on matrix values with an input signal (FIG. 1, 108). The stable MAC engine (232) may be used in a number of applications. For example, the stable MAC engine (232) may be used as a threshold logic gate (TLG) to perform a matrix product to compare the output with a threshold. Thus, the stable MAC engine (232) may be used as an accelerator in which the stable MAC engine (232) performs a number of functions faster than is possible for operations running on a more general-purpose processing device. Although the stable MAC engine (232) is depicted as being a device internal to the computing system (212), in another example, the stable MAC engine (232) may be a peripheral device coupled to the computing system (212) or included within a peripheral device coupled to the computing system (212).

The computing system (212) further includes a number of modules used in the implementation of the systems and methods described herein. The various modules within the computing system (212) include executable program code that may be executed separately. In this example, the various modules may be stored as separate computer program products. In another example, the various modules within the computing system (212) may be combined within a number of computer program products; each computer program product including a number of the modules.

The computing system (212) may include a MAC engine module (234) to, when executed by the processor (212), assist in the functionality of the stable MAC engine (232). The MAC engine module (234), for example, receives a number of input values representing a matrix to be processed in a MAC calculation. The MAC engine module (234) may send the input values to the stable MAC engine (232) as programming signals to a number of resistive memory elements (FIG. 1, 102) within the stable MAC engine (232) to program the resistive memory elements (FIG. 1, 102). The MAC engine module (234) may also receive an input signal to be processed in connection with the matrix programmed into the resistive memory elements (FIG. 1, 102). The MAC engine module (234) may further obtain a value representing the MAC, and convey that value as data to the computing system (212) or another computing device for analysis or further processing.

Figure 3:
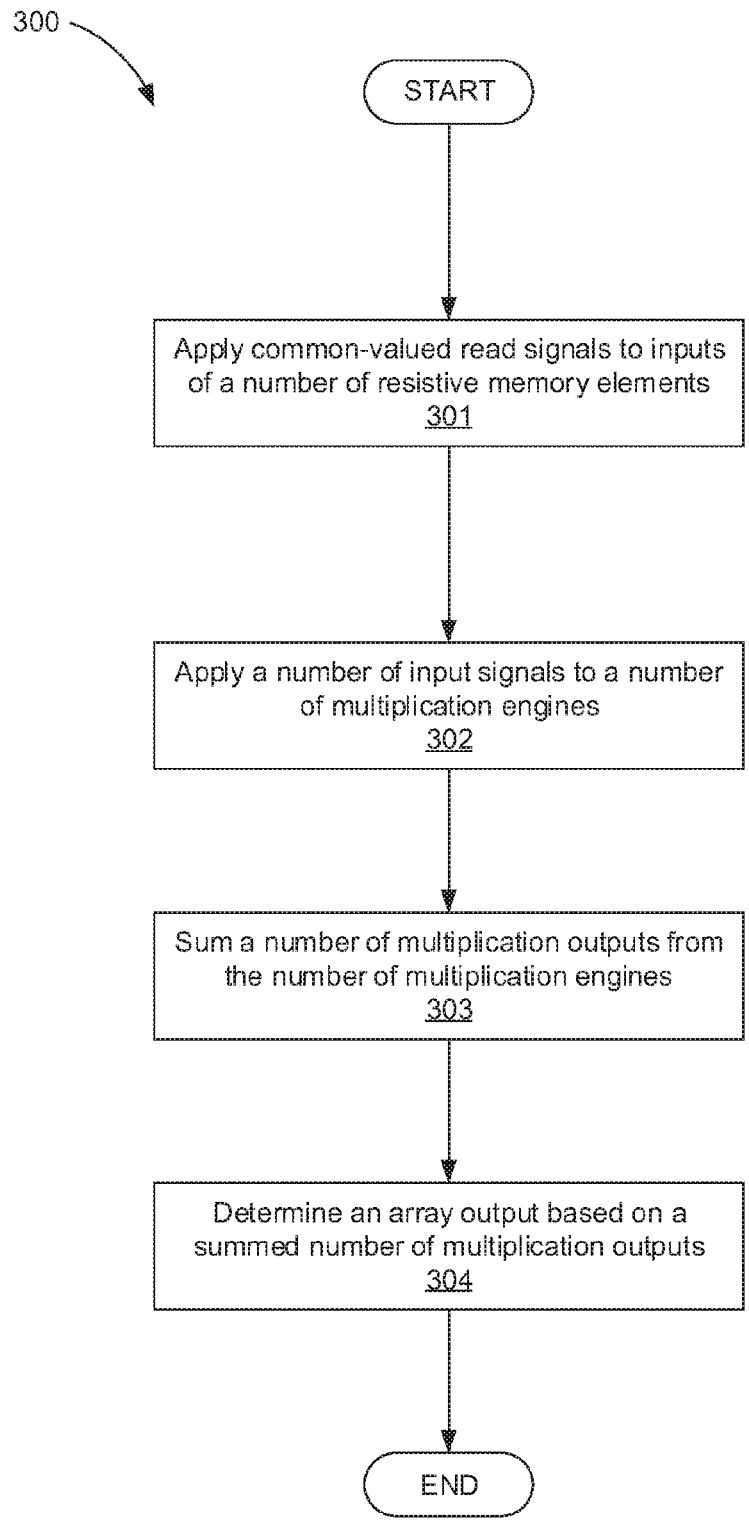
FIG. 3 is a diagram of a method for performing a MAC operation, according to one example of the principles described herein.

FIG. 3 is a diagram of a method (300) for performing a MAC operation, according to one example of the principles described herein. The method (300) may be described below as being executed or performed by at least one system, for example, the stable MAC engine (FIG. 2, 232) and/or the MAC engine module (FIG. 2, 234). Other suitable systems and/or computing devices may be used as well. The method (300) may be implemented in the form of executable instructions stored on at least one machine-readable storage medium of at least one of the systems and executed by at least one processor of at least one of the systems. Alternatively or in addition, the method (300) may be implemented in the form of electronic circuitry (e.g., hardware). In alternate examples of the present disclosure, the operations of the method (300) may be executed substantially concurrently or in a different order than shown in FIG. 3. In alternate examples, the method (300) may include more or less operations than are shown in FIG. 3. In some examples, a number of the operations of method (300) may, at certain times, be ongoing and/or may repeat.

The method (300) may include applying (block 301) a common-valued read signal (FIG. 1, 104) to inputs of a number of resistive memory elements (FIG. 1, 102). More specifically, each of the number of resistive memory elements (FIG. 1, 102) may receive a read signal (FIG. 1, 104) having the same value. For example, the common-valued read signal (FIG. 1, 104) may be a common-valued read voltage. In this example, each resistive memory element (FIG. 1, 102) may receive the same voltage value, which voltage value may be a largest value that is less than the switching voltage of the resistive memory elements (FIG. 1, 102). A specific numeric example is given as follows. In this example, the switching voltage of the number of resistive memory elements (FIG. 1, 102) may be 1.2 volts (V). Accordingly, the common-valued read voltage may be less than the switching voltage, i.e. 1.2 volts, but large enough to produce an optimized, or more efficient signal-to-noise ratio. An output of the resistive memory elements (FIG. 1, 102) may be based in part on this applied (block 301) common-valued read signal. For example, the output of a first resistive memory element (FIG. 1, 102-1) may be a current, $I_1$, which is defined by Ohm's law to as indicated in Equation 3 below.

$$I_1 = V_{read} \times G_1 \qquad \text{Equation 3.}$$

In Equation 3, $V_{read}$ represents the read signal applied (block 301) to the first resistive memory element (FIG. 1, 102-1) and $G_1$ represents the conductance, or reciprocal of the resistance, $R_1$, of the first resistive memory element (FIG. 1, 102). Similar currents may be output from the other resistive memory elements (FIG. 1, 102-2, 102-3).

According to the method, a number of input signals (FIG. 1, 108) may be applied (block 302) to a number of multiplication engines (FIG. 1, 106). In some examples, the input signals (FIG. 1, 106) may be part of a vector to be multiplied by the matrix. In other words, applying (block 302) a number of input signals (FIG. 1, 108) to a number of multiplication engines (FIG. 1, 106) may include applying a vector input signal (FIG. 1, 108) to the number of multiplication engines (FIG. 1, 106), each entry (FIG. 1, 108-1, 108-2, 108-3) in the vector input signal (FIG. 1, 108) being directed to a different multiplication engine (FIG. 1, 106-1, 106-2, 106-3). In some examples, the input signals (FIG. 1, 108) may be input voltages. The input voltages may be subsequently converted into input resistances. Each multiplication engine (FIG. 1, 106) may generate a multiplication output based on the input signals (FIG. 1, 108) and the resistive memory element (FIG. 1, 102) outputs. A multiplication output being based on a resistive memory element output, which may be a current, and an input signal (FIG. 1, 108), which may be a resistance (converted from a voltage), may also be a voltage as indicated above in Equation 1.

Each of the multiplication outputs from the multiplication engines (FIG. 1, 106) may be summed (block 303). For example, the accumulation engine (FIG. 1, 110) may sum the multiplication outputs via circuitry, for example. The method (300) also includes determining (block 304) an array output based on the summed number of multiplication outputs. The array output may be indicative of a result of the matrix multiplication of a matrix by an input signal (FIG. 1, 108), i.e., the MAC of the matrix with the input signal (FIG. 1, 108). As described above, MAC operations are used extensively in digital signal processing and using a single read signal (FIG. 1, 104) value in determining the MAC may allow for consistency of the matrix coefficients as represented by the resistance levels of the various resistive memory elements (FIG. 1, 102) that make up the matrix. Such consistency may allow for quicker processing as periodic recalibration is avoided as the coefficients are less likely to experience inadvertent changing.

Figure 4:
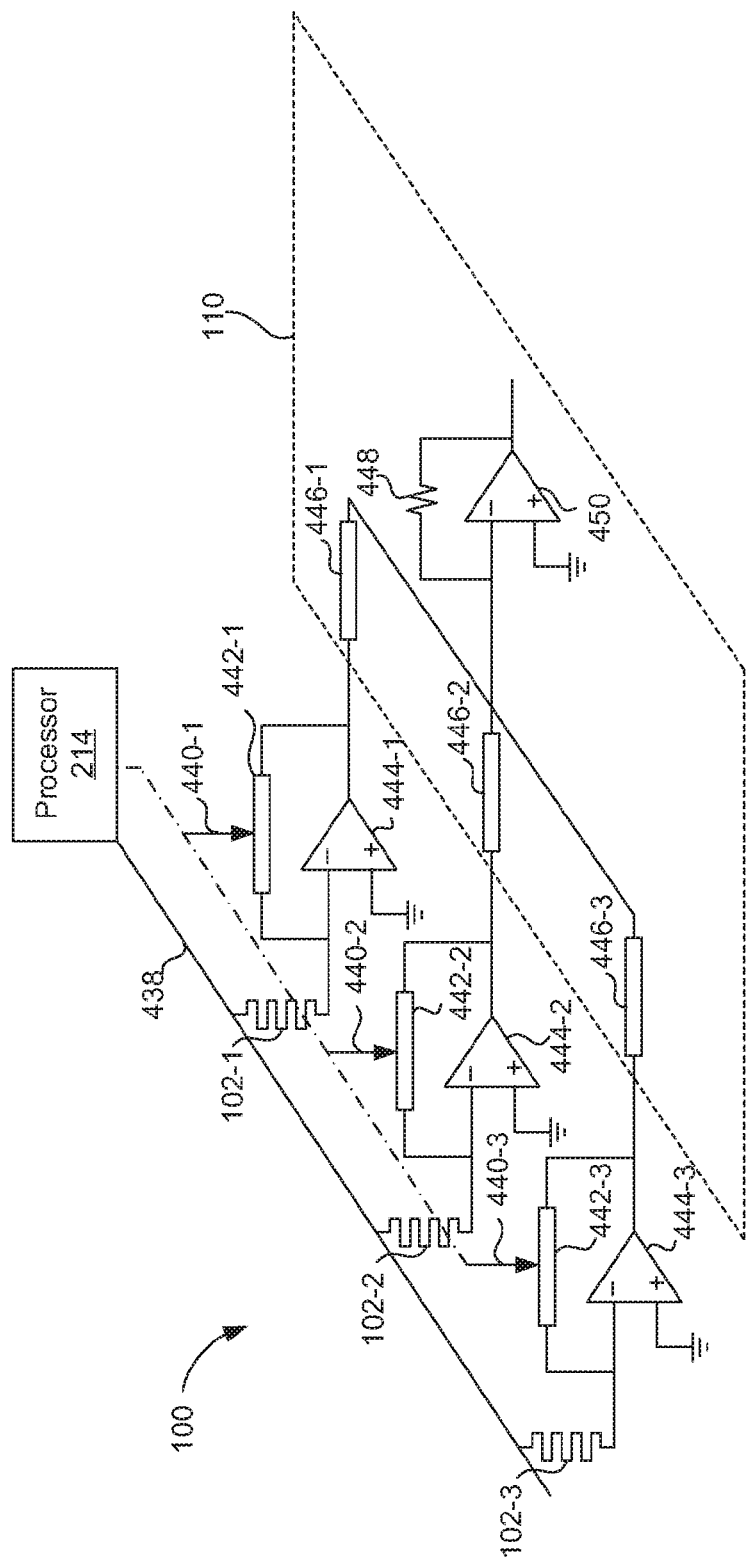
FIG. 4 is a diagram of a computing device that uses a resistive memory array for performing a MAC operation, according to another example of the principles described herein.

FIG. 4 is a diagram of a computing device using a resistive memory array (100) for performing a MAC operation, according to another example of the principles described herein. Although the resistive memory array (100) of FIG. 4 is depicted as having a circuit layout as depicted, any number of circuit layouts may be used to achieve the function of the present systems and methods. The array (100) may be coupled to a processor (214). The processor (214) may assist in the functionality of performing a MAC operation. For example, the processor (214) may at least manage application of a common-valued read voltage (438) to inputs of the number of resistive memory elements (102). The processor (214) may also manage application of an input vector (440) to the multiplication engines (FIG. 1, 106). More specifically, the processor (214) may apply an input vector with different entries (440-1, 440-2, 440-3) going to different multiplication engines (FIG. 1, 106). In FIG. 4 a distinction is made between the read voltage (438), a solid line, which is a same value passed to the resistive memory elements (102) and the input vector (440), a dashed-dot line, which may be different values passed to each multiplication engine (FIG. 1, 106).

In the example depicted in FIG. 4, the multiplication engines (FIG. 1, 106) may include an input converter (442) to convert a received input signal (FIG. 1, 108) into an input resistance. For example, as indicated above the input signal (FIG. 1, 108) may be an input voltage. More specifically, the input voltage may be a voltage vector (440). Accordingly, each input converter (442-1, 442-2, 442-3) may be a voltage-to-resistance converter to convert an input voltage into an input resistance. Similarly, if the input signal (FIG. 1, 108) is a current, the input converters (442) may be current-to-resistance converters to convert an input current signal into an input resistance.

As described above, the multiplication engines (FIG. 1, 106) may receive a resistive memory element output current to use in multiplication with the input resistance. In some examples, each multiplication engine (FIG. 1, 106) may include a multiplication operational amplifier (444-1, 444-2, 444-3) to amplify the resistive memory element output current received from a resistive memory element (FIG. 1, 102). As depicted in FIG. 4, the multiplication operational amplifiers (444) may be coupled to the resistive memory elements (FIG. 1, 102) via a negative input of the operational amplifiers (444), which are held at a virtual ground potential. In some examples, the multiplication operational amplifiers (444) may be designed with negative feedback through the input converters (442) such that all of the current from each resistive memory element (102) flows through the respective input converter (442), producing an output voltage as shown in Equation 1 (where $G_1$ is the conductance of the resistive memory element (102) and $R_{input}$ is the resistance of the input converter (442)).

An output of each multiplication engine (FIG. 1, 106), which multiplication engine (FIG. 1, 106) includes an input converter (442) and operational amplifier (444), may be collected via an accumulation engine (110). The output of the multiplication engines (FIG. 1, 106), being based on a current output from the resistive memory elements (FIG. 1, 102) and the input resistance, may be a voltage. In some examples, the multiplication output voltage may be further conditioned, by a signal conditioner (446-1, 446-2, 46-3) to be a multiplication output current, which is summed and passed to an output engine which may include an output resistor (448) and an output operational amplifier (450).

While FIG. 4 depicts a single dimensional resistive memory array (100), the resistive memory array (100) may be any dimension. For example, the resistive memory array (100) may be a resistive crossbar array that includes a number of row lines, a number of column lines intersecting the row lines to form a number of junctions. The number of resistive memory elements (102) may be coupled between the row lines and the column lines at the junctions.

Figure 5:
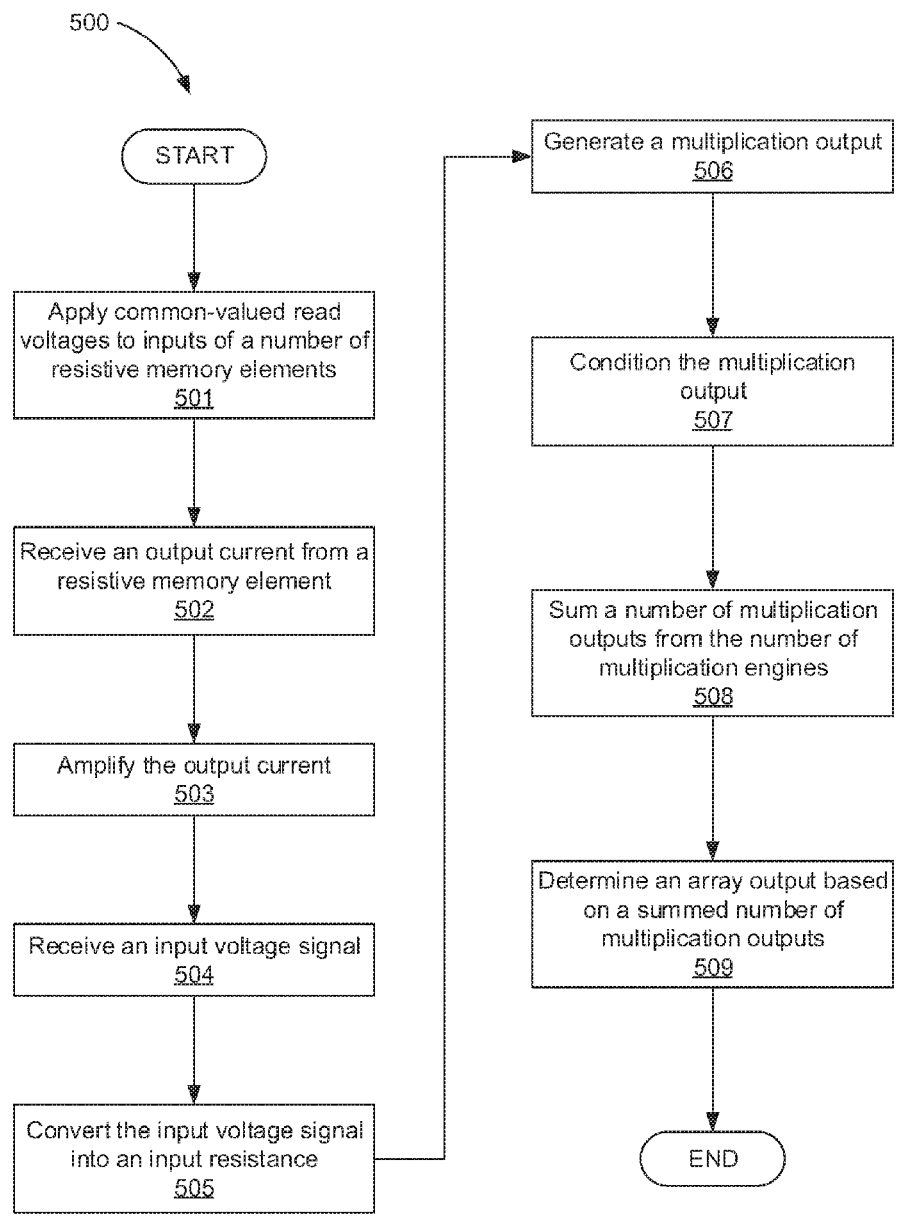
FIG. 5 is a diagram of a method for performing a MAC operation, according to one example of the principles described herein.

FIG. 5 is a diagram of a method (500) for performing a MAC operation, according to one example of the principles described herein. According to the method (500), a common-valued read voltage (FIG. 4, 438), such as a shared read voltage or different instances of a same valued read voltage, is applied to a number of resistive memory elements (FIG. 1, 102). In describing this method (500), $V_{read}$ may be used to indicate the common-valued read voltage (FIG. 4, 438). Applying (block 501) a common-valued read voltage (FIG. 4, 438) may be similar to applying (FIG. 3, block 301) a common-valued read signal (FIG. 1, 104) to inputs of a number of resistive memory elements (102) as described in connection with FIG. 3.

The method (500) includes receiving (block 502) an output current from a resistive memory element (FIG. 1, 102). In other words, as the common-valued read voltage (FIG. 4, 438) $V_{read}$ passes through a particular resistive memory element (FIG. 1, 102) such as a first resistive memory element (FIG. 1, 102-1) a resistive memory element output current, $I_1$, may be generated as defined by Equation 3. In other words, $I_1$ may be equal the product of $V_{read}$ and the conductance, $G_1$, of the first resistive memory element (FIG. 1, 102-1), which conductance $G_1$ is the reciprocal of the resistance, $R_1$, of the first resistive memory element (FIG. 1, 102-1). Similarly, other multiplication engines (FIG. 1, 106) may receive memory element outputs for other resistive memory elements (FIG. 1, 102). The method may include amplifying (block 503) the memory element output current, for example via the multiplication operational amplifiers (FIG. 4, 444).

An input voltage, $V_{input}$, may also be received (block 504). For example; an input converter (FIG. 4, 442) of the multiplication engine (FIG. 1, 106) may receive (block 504) an input voltage, $V_{input}$ and may convert (block 505) it into an input resistance. As a specific example, the first input converter (FIG. 4, 442-1) may receive a first entry in the input vector (FIG. 4, 440-1), which may be voltage $V_{input\_1}$, and may convert it into a first resistance input, $R_{input\_1}$. The first multiplication engine (FIG. 1, 106-1) may then generate (block 506) a multiplication output defined by Equation 1 discussed above and reproduced below.

$$V_{out\_1} = -G_1 \times R_{input\_1} \times V_{read} \quad \text{Equation 1.}$$

In other words, the output of a multiplication engine (FIG. 1, 106) may be voltage output. $V_{out\_1}$. Other multiplication engines (FIG. 1, 106) may similarly generate multiplication output voltages. In some examples, the multiplication outputs may be conditioned (block 507). For example, the number of multiplication outputs may be passed through a conditioning resistor having a value $R_a$. The conditioning resistor may be part of the accumulation engine (FIG. 1, 110). Each multiplication engine (FIG. 1; 106) may have a corresponding conditioning resistor coupled thereto. The conditioning resistor may convert the output voltages $V_{out\_i}$, where i represents the i-th multiplication output, into a current, $I_{out\_i}$. The accumulation engine (FIG. 1, 110) may then sum (block 508) a number of multiplication output currents from the number of multiplication engines (FIG. 1, 106) as represented by Equation 4 below.

$$\Sigma_i I_{out\_i} \quad \text{Equation 4.}$$

An output engine of the accumulation engine (FIG. 1, 110) may then further process the summation of the various multiplication output currents to determine (block 509) an array output voltage. Accordingly, the array output voltage may be defined by Equation 5 below.

$$V_{array\_out} = (R_f/R_a) \times V_{read} \Sigma_k (R_{input\_k} \times G_k) \quad \text{Equation 5.}$$

In Equation 5, $V_{array\_out}$ represents the array output voltage, $R_f$ the resistance of the accumulation engine (FIG. 1, 110) opamp feedback resistor (FIG. 4, 448), and $R_a$ the resistance of the various conditioning resistors, which may be the same value for each multiplication engine, (FIG. 1, 106).

Figure 6:
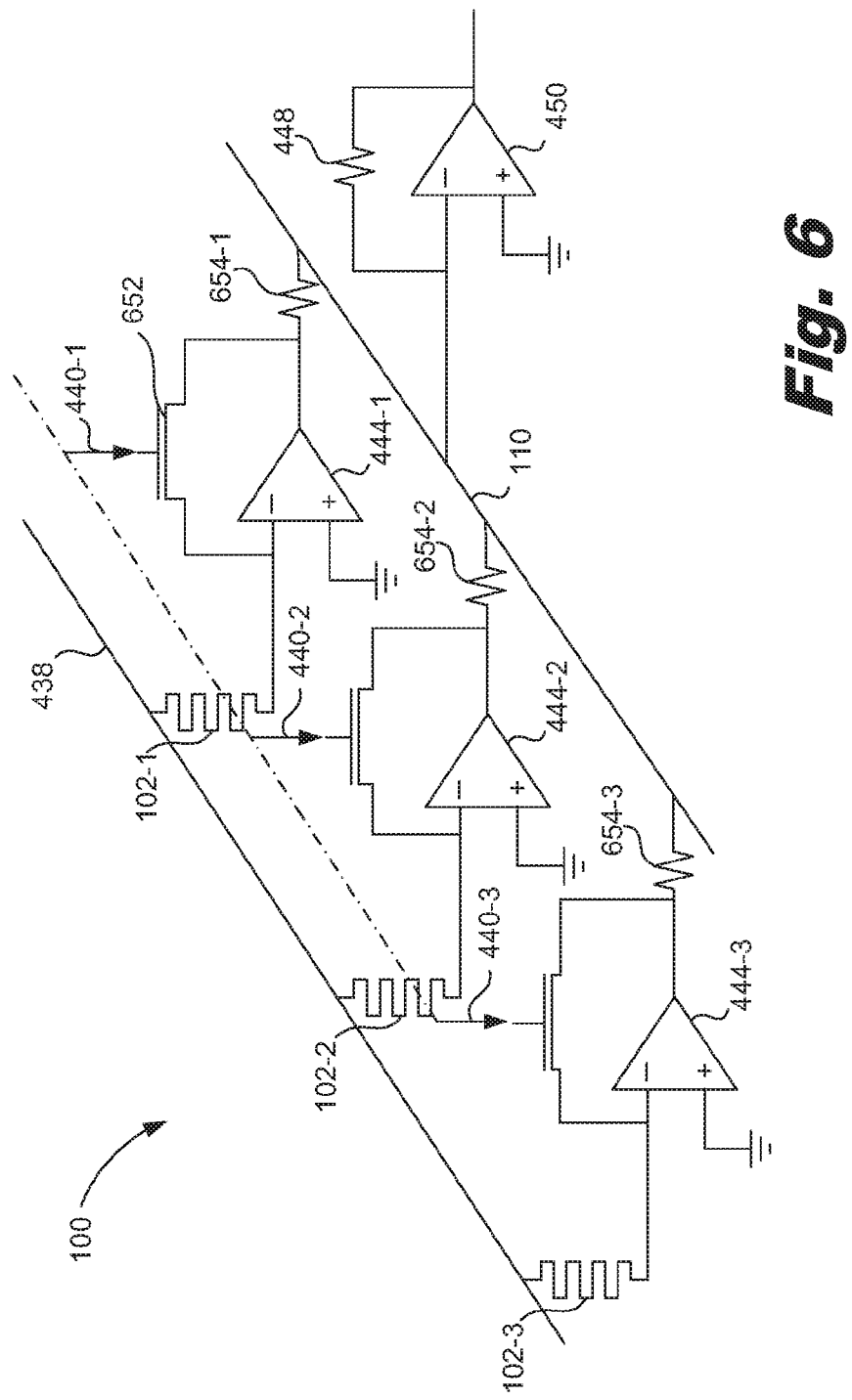
FIG. 6 is a diagram of a resistive memory array for performing a MAC operation, according to another example of the principles described herein.

FIG. 6 is a diagram of a resistive memory array (100) for performing a MAC operation, according to another example of the principles described herein. As described above, an input signal (FIG. 4, 440) may be converted into a resistance by an input converter (FIG. 4, 422). Specifically in one example, the input converter (FIG. 4, 442) may be a meta-oxide semiconductor field-effect transistor (MOSFET) (652). While FIG. 6 specifically depicts a MOSFET (652) as the input converter (FIG. 4, 442), other types of input converters may be implemented in accordance with the principles described herein. For example, the input converter (FIG. 4, 442) may be a voltage controlled resistor (VCR). The input converter (FIG. 4, 442) may also include other components to further process an input signal (FIG. 4, 440) such that it can be used in a MAC operation. For simplicity, one MOSFET (652) is indicated with a reference number, however a number of MOSFETS (652) may be implemented, such as a number equal to, and corresponding to, the multiplication engines (FIG. 1, 106).

As described above, in some examples, the multiplication outputs may be further conditioned. For example, the multiplication outputs may be passed through a conditioning resistor (654) of the accumulation engine (FIG. 1, 110) that converts the multiplication outputs from a voltage to a current for example. Each conditioning resistor (654-1, 654-2, 654-3) may have the same value to equally convert each multiplication output.

Figure 7:
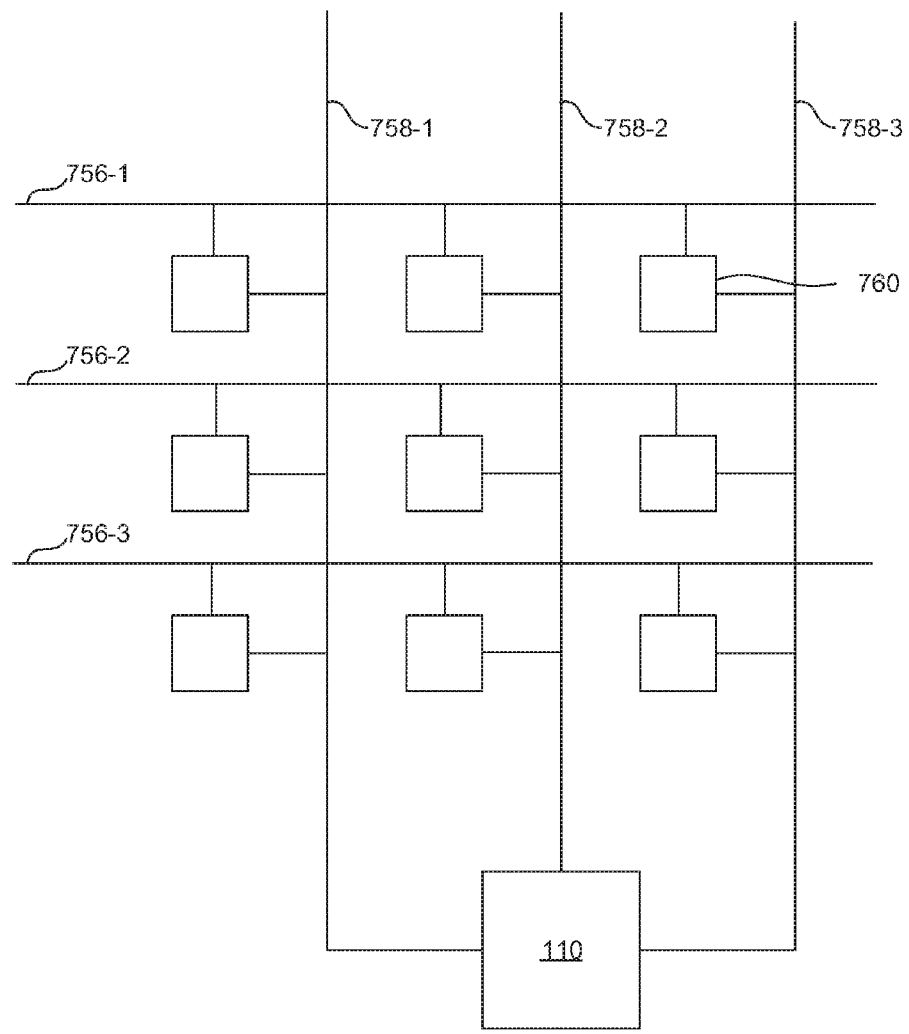
FIG. 7 is a diagram of a resistive memory array for performing a MAC operation, according to another example of the principles described herein.

FIG. 7 is a diagram of a resistive memory array for performing a MAC operation, according to another example of the principles described herein. As described above, the resistive memory elements (FIG. 1, 102) may be organized in a cross bar array. Specifically, the resistive memory elements (FIG. 1, 102) may be organized into rows and columns joined together by a number of row lines (756-1, 756-2, 756-3) and column lines (758-1, 758-2, 758-3). One or more of the row lines (756) and column lines (758) may supply the common-valued read signal (FIG. 1, 104) or the number of input signals (FIG. 1, 108). In FIG. 7, the combination of the resistive memory element (FIG. 1, 102), the multiplication engine (FIG. 1, 108) and the signal conditioner (FIG. 4, 446) may be indicated by the box (760). For simplicity a single box (760) is identified by a reference number. In the cross bar array of FIG. 7, a resistive memory element (FIG. 1, 102) is coupled to a particular row line (756) and a particular column line (758).

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 2, 214) of the computing system or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

Certain examples of the present disclosure are directed to a resistive memory array (FIG. 1, 100) for performing a MAC operation using a common-valued read signal (FIG. 1, 104) that provide a number of advantages not previously offered including, maintaining resistance states of the resistive memory elements (FIG. 1, 102) of the array (FIG. 1, 100) so as to preserve the coefficients of the matrix used in the MAC thereby preserving the validity of the MAC results; reducing the need for recalibration of the array (FIG.

What is claimed is:

1. A resistive memory array comprising:
a number of resistive memory elements to receive a common-valued read signal, in which a resistance of a resistive memory element defines a value within a matrix;
a number of multiplication engines to perform a multiply operation by:
receiving a memory element output from a corresponding resistive memory element;
receiving an input signal; and
generating a multiplication output based on a received memory element output and a received input signal;
a conditioning resistor to condition the multiplication outputs; and
an accumulation engine to sum the multiplication outputs from the number of multiplication engines, in which the summed multiplication outputs represent a multiplication of the matrix and a number of input signals.

2. The array of claim 1, in which the number of resistive memory elements are to receive one of a shared read signal and distinct instances of read signals having the same value.

3. The array of claim 1, in which the number of multiplication engines comprise a voltage-to-resistance converter to convert an input voltage signal into an input resistance.

4. The array of claim 1, in which the number of multiplication engines comprise a current-to-resistance converter to convert an input current signal into an input resistance.

5. The array of claim 1, in which the number of resistive memory elements are memristors.

6. The array of claim 1, in which each of the number of multiplication engines is respectively coupled to a corresponding one of the number of resistive memory elements.

7. A method for performing a multiply-accumulate operation, the method comprising:
applying a common-valued read signal to inputs of a number of resistive memory elements;
applying a number of input signals to a number of multiplication engines, in which a multiplication engine is coupled to a resistive memory element;
conditioning a number of the multiplication outputs;
summing a number of the multiplication outputs from the number of multiplication engines, in which a multiplication output represents a multiplication of a resistive memory element output and an input signal; and
determining an array output based on a summed number of the multiplication outputs.

8. The method of claim 7, in which:
the common-valued read signal comprises a common-valued read voltage;
the resistive memory element output comprises a current;
the number of input signals comprises a number of input voltages;
the number of multiplication outputs comprise a number of multiplication output voltages; and
the array output comprises an array output voltage.

9. The method of claim 7, in which conditioning the number of multiplication outputs comprises passing the number of multiplication outputs through a conditioning resistor, in which a multiplication engine is coupled to a corresponding conditioning resistor.

10. The method of claim 7, in which:
applying a number of input signals to a number of multiplication engines comprises applying a vector input signal to the number of multiplication engines; and
an entry in the vector input signal is directed to a different multiplication engine.

11. The method of claim 7, in which applying a common-valued read signal to inputs of a number of resistive memory elements comprises applying a common-valued read voltage that is a largest voltage less than a switching voltage of the number of resistive memory elements.

12. A computing device comprising:
a processor; and
a resistive memory array coupled to the processor, the resistive memory array comprising:
a number of resistive memory elements to receive a common-valued read voltage, in which a resistance of a resistive memory element defines a value within a matrix;
a number of multiplication engines to perform a multiplication operation, in which each multiplication engine:
is respectively coupled to a resistive memory element;
is to receive a resistive memory element output current;
is to output a multiplication current;
comprises an operational amplifier to amplify the resistive memory element output current; and
comprises an input converter to convert a received input voltage into a resistance, in which the received input voltage represents an input signal to be multiplied by the matrix;
a conditioning resistor to condition a number of the output multiplication currents; and
an accumulation engine to sum a number of the multiplication currents to generate an array output voltage.

13. The computing device of claim 12, in which the resistive memory array is a resistive crossbar array comprising:
a number of row lines; and
a number of column lines intersecting the row lines to form a number of junctions;
in which the number of resistive memory elements are coupled between the row lines and the column lines at the junctions.

14. The computing device of claim 12, in which the voltage-to-resistance converter is a metal-oxide semiconductor field-effect transistor (MOSFET).

* * * * *